(12) United States Patent
Browne et al.

(10) Patent No.: US 10,212,827 B2
(45) Date of Patent: Feb. 19, 2019

(54) APPARATUS FOR INTERCONNECTING CIRCUITRY

(71) Applicant: Intel Corporation, Santa Clara, CA (US)

(72) Inventors: John J. Browne, Limerick (IE); Andrew Maclean, Limerick (IE); Shawna M. Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 172 days.

(21) Appl. No.: 15/201,323

(22) Filed: Jul. 1, 2016

(65) Prior Publication Data
US 2018/0007796 A1  Jan. 4, 2018

(51) Int. Cl.
*H05K 3/34* (2006.01)
*H05K 1/02* (2006.01)
(Continued)

(52) U.S. Cl.
CPC .............. *H05K 3/34* (2013.01); *G06F 13/00* (2013.01); *H05K 1/0293* (2013.01); *H05K 1/141* (2013.01); *H05K 2201/0305* (2013.01); *H05K 2201/042* (2013.01); *H05K 2201/09036* (2013.01); *H05K 2201/10181* (2013.01); *H05K 2201/10189* (2013.01); *H05K 2201/10212* (2013.01);
(Continued)

(58) Field of Classification Search
CPC .................. G11C 17/165; G11C 17/18; H01L 2924/0002; H01L 2924/00; H05K 3/34
See application file for complete search history.

(56) References Cited

U.S. PATENT DOCUMENTS 5,341,267 A  *  8/1994  Whitten .................. H01L 23/60
257/530
6,229,378 B1  5/2001  Gourley et al.
(Continued)

FOREIGN PATENT DOCUMENTS

WO    WO 2009-021410    2/2009
WO    WO-2015122870    8/2015
WO    WO 2015-148944    10/2015

OTHER PUBLICATIONS

International Search Report and Written Opinion from PCT/US2017/0300886 dated Aug. 11, 2017, 11 pgs.

*Primary Examiner* — Paul D Kim
(74) *Attorney, Agent, or Firm* — Schwabe, Williamson & Wyatt P.C.

(57) ABSTRACT

Techniques and mechanisms for controlling configurable circuitry including an antifuse. In an embodiment, the antifuse is disposed in or on a substrate, the antifuse configured to form a solder joint to facilitate interconnection of circuit components. Control circuitry to operate with the antifuse is disposed in, or at a side of, the same substrate. The antifuse is activated based on a voltage provided at an input node, where the control circuitry automatically transitions through a pre-determined sequence of states in response to the voltage. The pre-determined sequence of states coordinates activation of one or more fuses and switched coupling one or more circuit components to the antifuse. In another embodiment, multiple antifuses, variously disposed in or on the substrate, are configured each to be activated based on the voltage provided at an input node.

15 Claims, 11 Drawing Sheets

(51) Int. Cl.
*G06F 13/00* (2006.01)
*H05K 1/14* (2006.01)
(52) U.S. Cl.
CPC ............... *H05K 2203/1115* (2013.01); *H05K 2203/173* (2013.01)

(56) References Cited

U.S. PATENT DOCUMENTS

| | | | |
|---|---|---|---|
| 6,441,676 | B1 | 8/2002 | Koehl et al. |
| 6,690,597 | B1 * | 2/2004 | Perlov ................. G11C 11/5692 365/100 |
| 7,482,854 | B2 * | 1/2009 | Choi ....................... G11C 17/18 327/525 |
| 8,101,471 | B2 | 1/2012 | Hafez et al. |
| 9,190,166 | B2 * | 11/2015 | Kanda .................. G11C 17/165 |
| 2006/0214261 | A1 | 9/2006 | You et al. |
| 2009/0273056 | A1 | 11/2009 | Ohkubo et al. |
| 2011/0080765 | A1 | 4/2011 | Groepl et al. |

\* cited by examiner

APPARATUS FOR INTERCONNECTING CIRCUITRY

BACKGROUND

1. Technical Field

This disclosure relates generally to configurable circuitry, and more particularly, but not exclusively, to circuitry to control interconnection via an antifuse device.

2. Background Art

In conventional computer assemblies, integrated circuit (IC) components are typically connected to one another via a surface on which the components are disposed. Two dies, for example, may be mounted to a common substrate having metal lines that interconnect ICs of the dies with one another. A "three-dimensional" interconnection scheme may be more desirable, in certain instances. Handheld devices may, for example, require a more compact packaging arrangement. In other applications, performance is inhibited if metal lines were to be limited to only one level of a substrate.

Currently microelectronics assembly techniques common use pick-and-place arrangement of components down onto a substrate, followed by a batch reflow through an oven to solidify one or more interconnects coupling such components. Another typical microelectronics assembly process involves sequential thermal compression bonding of components using an anisotropic conductive film or paste. Still other techniques include sequential adhesive bonding, wire-bonding and laser direct structuring of external connections between assembled components.

These various processes are fairly efficient for interconnecting components which are assembled and interconnected via a single plane. However, any further assembling and interconnecting with other components, in other planes, generally tends to be significantly more complicated and expensive. As successive generations of circuit technologies continue to trend toward smaller scale and tighter integration, there is expected to be a larger premium placed on incremental improvements to techniques for interconnecting circuit components.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
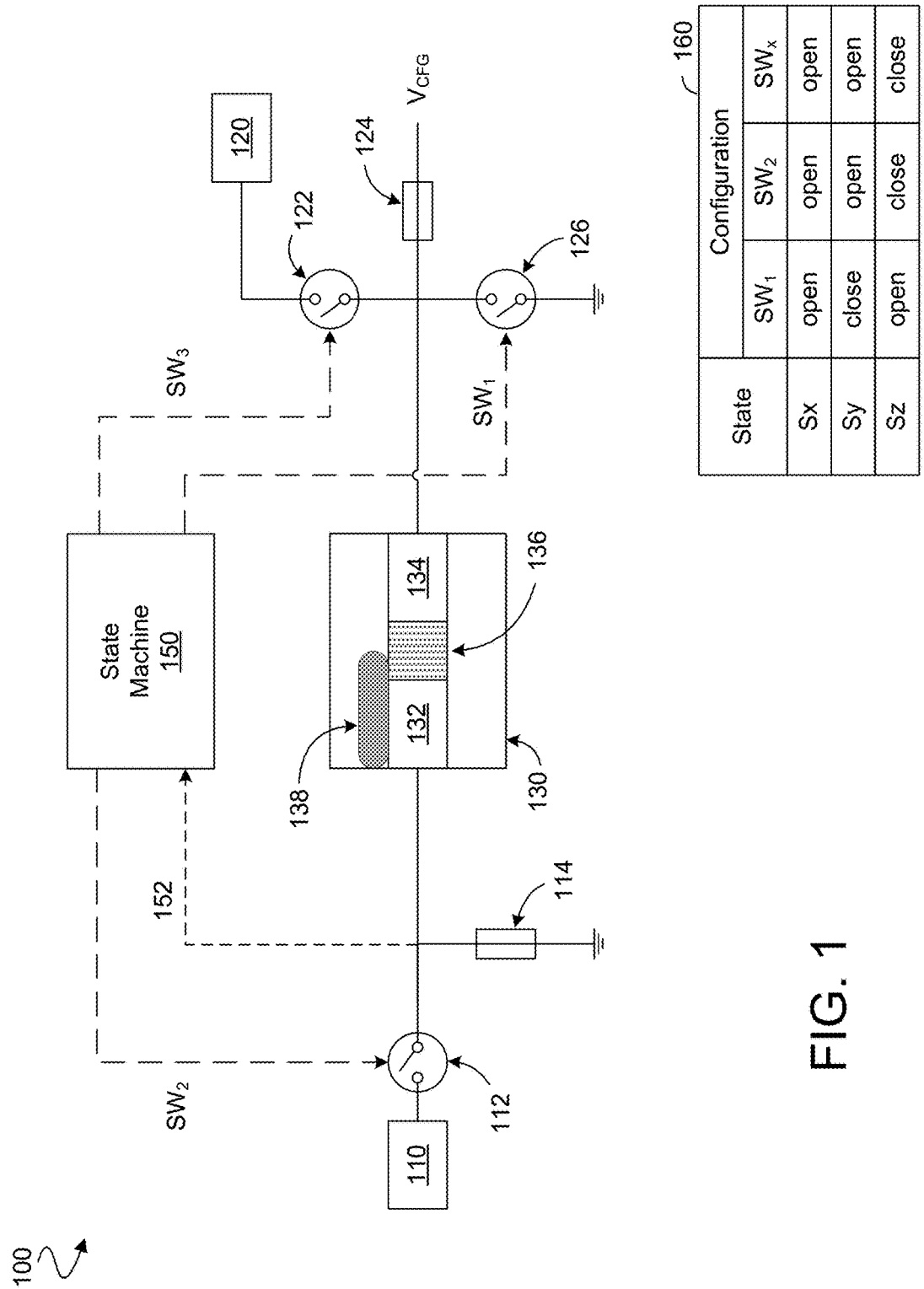
FIG. 1 shows a circuit diagram illustrating elements of a system including an antifuse to interconnect circuit components according to an embodiment.

Embodiments described herein variously provide techniques and/or mechanisms to facilitate automatic interconnection of circuit components with one another via an antifuse. In an embodiment, an antifuse device is disposed in or on a substrate, wherein selective interconnection of the circuit components via the antifuse device is enabled by circuitry that is disposed in the substrate or at a surface of the substrate.

Such circuitry may include a state machine that is configured to operate based on an indication that a voltage difference has been applied across the antifuse device. For example, based on an activation of the antifuse device resulting from the voltage difference—e.g., the activation including the formation of a conductive path therein—the state machine may transition through a pre-determined sequence of states. In an embodiment, the state machine may operate one or more fuses and one or more switches via control signals that are variously generated at different times based on the pre-determined sequence of states. The one or more fuses and one or more switches—some or all of which may each be variously disposed in the substrate, at a surface of the substrate or part of an assembly of components—may be variously operated to provide a particular sequence of circuit configurations for interconnecting the circuit components. As compared to existing architectures for configurable circuitry, various embodiments provide an easily scalable mechanism for automatically operating antifuse functionality based on relatively simple input requirements—e.g., including only one input voltage.

Certain features of some embodiments are described herein with reference to an antifuse device that is disposed in or on a substrate, wherein control circuitry (e.g., a state machine) is disposed in or at a side of the substrate, the control circuitry to operate in response to an activation of the antifuse device. However, such discussion may be extended to additionally or alternatively apply to other circuitry disposed in or at a side of the substrate. For example, in other embodiments, the control circuitry may be disposed in a same packaged circuit device with the antifuse device (but instead disposed in or at a side of another substrate). In such an embodiment, the control circuitry may be coupled to operate one or more switches and/or one or more fuses that are disposed on the same substrate as the antifuse device—e.g., in response to an activation of the antifuse device.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including a substrate having disposed therein or thereon an antifuse device and state machine logic configured to configure an interconnect using the antifuse device.

FIG. 1 illustrates features of a system 100 to selectively provide an interconnect path according to an embodiment. System 100 is one example of an embodiment wherein an antifuse device is disposed in or on a substrate, the antifuse device operable with a state machine to provide for operation of interconnected circuit components. In the illustrative embodiment shown, system 100 includes an antifuse device 130 comprising conductors 132, 134, wherein a region 136 is located between conductors 132, 134. Prior to an activation of antifuse device 130 (the activation to form a solder joint) region 136 may function as a high impedance area to limit a conducting of current between conductors 132, 134. Antifuse device 130 may further include a compound 138, disposed on or near region 136, which is to facilitate an automatic formation of a solder joint across region 136. Antifuse device 130 may form a chamber that is fluid-tight or otherwise configured to direct or limit the flow of a metal alloy of compound 138. For example, antifuse device 130 may include ceramic sidewalls (not shown) and/or other structures to mechanically confine and electrically insulate a solder joint in antifuse device 130.

Compound 138 may include an alloy of Tin (Sn) and Lead (Pb), an alloy of Tin (Sn), Silver (Ag) and Copper (Cu) or any of a variety of other alloys which, for example, are adapted from conventional soldering techniques. In some embodiments, compound 138 includes any of various other metals, such as Bismuth (Bi), Zinc (Zn) etc., used in traditional solders. Compound 138 may further include, or be configured to flow over, a flux material which is to prepare conductors 132, 134 for the formation of a solder joint. For example, such a flux material may include an ammonium chloride substance, an organic acid (e.g., a resin acid) or any of various other materials adapted from conventional soldering techniques. In some embodiments, conductors 132, 134 are pre-coated with such a flux material.

Conductors 132, 134 may each function as (or alternatively, couple to) a respective one of two terminal of antifuse device 130, wherein other circuit structures of system 100 are to variously couple to antifuse device 130 each via a respective one of the two terminals. Conductors 132, 134 may include copper, silver gold and/or any of various other metals that (at least prior to the formation of a solder joint) have a conductivity greater than that across region 136. For example, region 136 may have disposed therein a relatively high resistance element—e.g., comprising Tungsten (W)— that is susceptible to heating in response to a voltage difference applied across the terminals of antifuse device 130. In another embodiment, region 136 includes an air gap of other open circuit structure that is configured to facilitate electrical arcing between conductors 132, 134 in response to a potential difference.

Activation of antifuse device 130 may include application of a voltage difference across conductors 132, 134. Due to a level and/or duration of the voltage difference, one or more structures in or adjoining region 136 may be heated—e.g., due to impedance characteristics of the one or more structures, due to electrical arching and/or the like. As a result of such heating, a flow of compound 138 may take place. For example, a metal alloy of compound 138 may transition from a solid to a liquid state, resulting in compound 138 moving into region 136 to form a conductive path between conductors 132, 134. During or after such a flow, compound 138 may be allowed to cool—e.g., by reducing or stopping the voltage difference applied across conductors 132, 134. Compound 138 may then harden to form a solder joint at respective ends of conductors 132, 134.

In the illustrative embodiment shown, system 100 further includes or couples to a circuit component 110 and a circuit component 120, wherein antifuse device 130 is to facilitate a selective formation of an interconnect path between circuit components 110, 120. For example, antifuse device 130 may be coupled via conductor 132 to first circuitry which includes circuit component 110, switch 112 and fuse 114. In such an embodiment, antifuse device 130 may be further coupled via conductor 134 to second circuitry which includes circuit component 120, switch 122, fuse 124 and switch 126. System 100 may include only some of such first circuitry and/or only some of such second circuitry, in different embodiments.

To activate antifuse device 130, a voltage difference across conductors 132, 134 may be applied, for example, using a voltage $V_{CFG}$ which is input via fuse 124. Switches 126, 112 and 122 may be variously operated—e.g., by respective control signals $SW_1$, $SW_2$, $SW_3$—to facilitate coupling of circuit components 110, 120 to one another via a solder joint formed at antifuse device 130. For example, switches 126, 112 and 122 may be variously transitioned between respective open states and respective closed states to selectively provide coupling of antifuse device 130 to (or decoupling of antifuse device 130 from) various circuit nodes of system 100.

In an embodiment, system 100 includes control circuitry—such as the illustrative state machine 150 shown—to generate or otherwise control some of all of control signals $SW_1$, $SW_2$, $SW_3$ in response to an indication that $V_{CFG}$ has resulted in a voltage difference across antifuse device 130. For example, state machine 150 may be coupled to detect an indication 152 of a spike (or other change) to a current or voltage at terminal/conductor 132. Such a change may indicate the formation, by compound 138, of a conductive path across region 136.

State machine 150 may include digital circuitry (e.g., comprising any of a variety of combinations of logic gates, flip-flops, counters and/or the like) configured to transition, in response to indication 152, through a predetermined sequence of states—e.g., each state including or otherwise corresponding to a particular combination of signaling by $SW_1$, $SW_2$ and $SW_3$. In one illustrative embodiment, state machine 150 is to transition through a sequence {Sx, Sy, Sz} of three states. For example, switches 112, 126, 122 may be pre-set to a configuration corresponding to state Sx at a time when $V_{CFG}$ is sufficient to activate antifuse device 130. Some or all of states Sx, Sy, Sx may each result in state machine 150 signaling whether $SW_1$ is to open or close switch 126, whether $SW_2$ is to open or close switch 112 and/or whether $SW_3$ is to open or close switch 122. Table 160 represents one example of various configurations to be provided by states Sx, Sy and Sz according to an embodiment.

State machine 150 may transition transitions through the sequence {Sx, Sy, Sz} according to a predetermined timing scheme. In another embodiment, such timing may be based on state machine 150 detecting one or more conditions that are subsequent to indication 152. For example, state machine 150 may be further coupled to receive, and perform a state transition in response to, a signal (not shown) indicating when fuse 124 has been blown. In an embodiment, state transitions of state machine 150 are powered and/or otherwise enabled by $V_{CFG}$ or some other supply voltage that is concurrent with $V_{CFG}$.

State machine 150—and in some embodiments, additional circuitry of system 100—may be disposed in, or at a side of, a substrate (not shown) in which or on which is disposed antifuse device 130. For example, the substrate may be a semiconductor substrate of an IC die—e.g., wherein antifuse device 130 is a circuit element that is integrated with the semiconductor substrate. In such an embodiment, antifuse device 130 may be selectively activated to facilitate interconnection of circuit components on the same IC die or, alternatively, different respective IC dies. Alternatively, the substrate may be an interposer interconnects multiple IC dies of a single packaged microelectronic device. In such an embodiment, the antifuse device 130 may facilitate interconnection, via the substrate, between circuit components of different respective IC dies. In still another embodiment, the substrate is that of a printed circuit board— e.g., wherein antifuse device 130 is to facilitate interconnection between different respective packaged devices. Some or all of fuse 124 and switches 122, 126 may be variously disposed in, or at a side of, the same substrate as state machine 150. In such an embodiment, fuse 114 and switch 112 may also be variously disposed in or at a side of such a substrate, although some embodiments are not limited in this regard.

Figure 2:
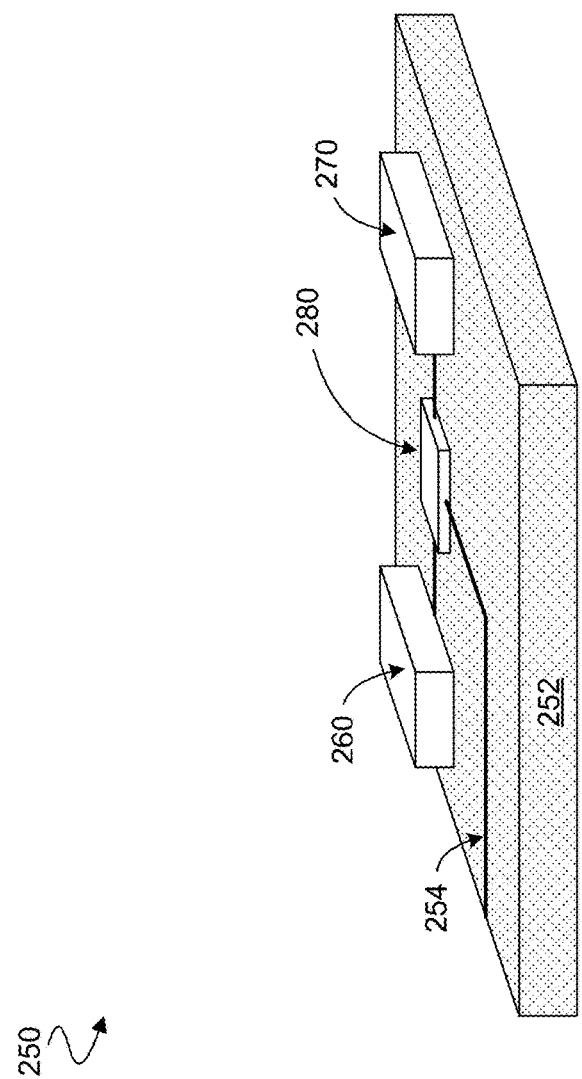
FIG. 2 shows a perspective view diagram illustrating elements of a system including an antifuse to interconnect circuit components according to an embodiment.

FIG. 2 shows a perspective view of a system 250 to provide antifuse functionality according to an embodiment. System 250 may include some or all of the features of system 100, for example. In the illustrative embodiment shown, system 250 includes substrate 252 having device 280 formed therein or thereon. Substrate 252 may include any of a variety of insulating structures and interconnects variously extending through such insulating structures. By way of illustration and not limitation, substrate 252 may include a semiconductor substrate, an interposer or a printed circuit board by which integrated circuits are to be selectively coupled to one another. In various embodiments, substrate 252 may include a molded interconnect substrate (MIS), a Flip Chip-Chip Scale Package (FC-CSP) substrate, a flexible backplane (e.g., including cellulose or a polyethylene terephthalate film) or the like. Device 280 may be operable to form a solder joint between such integrated circuits—e.g., wherein the ICs are on the same die, in different IC dies of the same packaged device or in different packaged devices.

For example, device 280 may provide functionality of antifuse device 130 and state machine 150 (and, in some embodiments, functionality of some or all of fuses 114, 124 and switches 112, 122, 126). System 250 may further include or couple to circuit components 260, 270—e.g., wherein circuit component 260 and/or circuit component 270 are each disposed in or on substrate 252. Operation of device 280 may include activation of an antifuse device therein to form a solder joint between circuit components 260, 270. Such operation may further include various processes with a state machine and switch elements (not shown) of device 280 to facilitate communication of a signal or voltage via the solder joint.

In an embodiment, substrate 252 has formed therein or thereon one or more conductive traces 254 each to provide a respective signal or voltage to device 280. For example, the one or more traces 254 may provide a ground (or other reference potential) $V_{CFG}$, a supply voltage to operate state machine circuitry and/or the like. In some embodiments, the one or more traces 254 are to communicate one or more control signals to or from device 280—e.g., wherein such one or more control signals include one or more of $SW_1$, $SW_2$ and $SW_3$.

In providing tight integration of an antifuse device with state machine logic (and in some embodiments, one or more switches or fuses to be operated with the state machine logic), some embodiments variously provide a configurable circuit solution that is easily implemented in or on a substrate—e.g., including implementation in multiple different layers of a substrate. Such configurable circuit solutions may be readily scaled for on-chip applications, intra-packet applications, inter-chip applications or the like.

Figure 3:
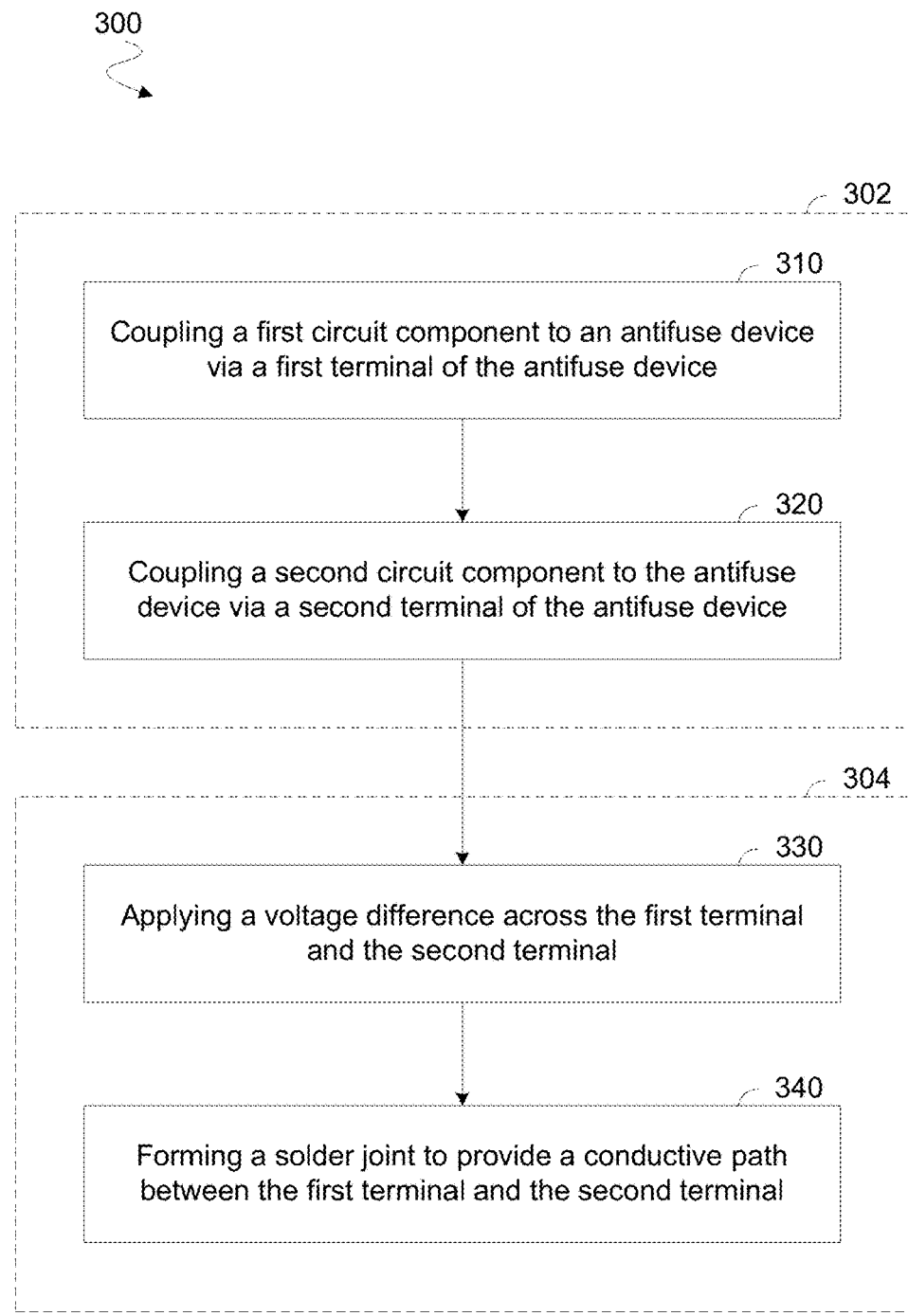
FIG. 3 is a flow diagram illustrating elements of a method for providing antifuse functionality according to an embodiment.

FIG. 3 illustrates features of a method 300 to operate an anti-fuse device according to an embodiment. Method 300 may be performed with circuitry of system 100—e.g., to form a solder joint at antifuse device 130. To illustrate certain features of various embodiments, method 300 is described herein with reference to an antifuse device (e.g., device 130), a first fuse and second fuse (e.g., fuses 124 and 114, respectively), a first switch, second switch and third switch (e.g., switches 126, 122 112, respectively), a first circuit component and second circuit component (e.g., components 120 and 110, respectively) and a state machine (e.g., state machine 150).

Method 300 may include operations 302 to manufacture a system including such an antifuse device. For example, operations 302 may include, at 310, coupling a first circuit component to an antifuse device via a first terminal (e.g., at conductor 134) of the antifuse device. For example, the first terminal may facilitate coupling of the antifuse device 130 to the first circuit component via the second switch, and further facilitate coupling of the antifuse device 130 to the first fuse and the first switch.

Operations 302 may further include, at 320, coupling a second circuit component to the antifuse device via a second terminal (e.g., at conductor 132) of the antifuse device. For example, the second terminal may facilitate coupling of the antifuse device 130 to the second circuit component via the third switch, and further facilitate coupling of the antifuse device 130 to the second fuse. In an embodiment, the antifuse device is disposed on or on a substrate—e.g., wherein a state machine to operate with the antifuse device is disposed in, or at a side of, that substrate.

Alternatively, or in addition, method 300 may include operations 304 to activate an antifuse device and, in some embodiments, to operate state machine login based on such activation of the antifuse device. For example, operations 304 may include, at 330, applying a voltage difference across the first terminal and the second terminal. The applying at 330 may include, for example increasing or otherwise providing $V_{CFG}$ (or other such voltage) at an input node which is coupled to the antifuse device via the first fuse. The applying at 330 may begin while each of the first switch, second switch and third switch is in a respective open state and while the first fuse and second fuse each provide a respective short circuit path.

Operations 304 may further comprise, at 340, forming a solder joint at the antifuse device, wherein the solder joint provides a connective path between the first terminal and the second terminal. In an embodiment operations 304 include one or more additional processes (not shown) to variously facilitate communication between the first circuit component and the second circuit component via the solder joint. For example, such additional processes may include operating circuitry of the state machine in response the voltage difference applied at 330 (e.g., response to an indication of the solder joint being formed at 340 based on the voltage difference). In an embodiment, the method 300 further comprises automatically transitioning the state machine through a plurality of states according to a pre-defined sequence. The automatic transitioning may result in operation of the first switch and the second switch (and in some embodiments, the third switch as well), wherein the state machine controls a coupling of the first circuit component to a second component via the solder joint.

Figure 4A:
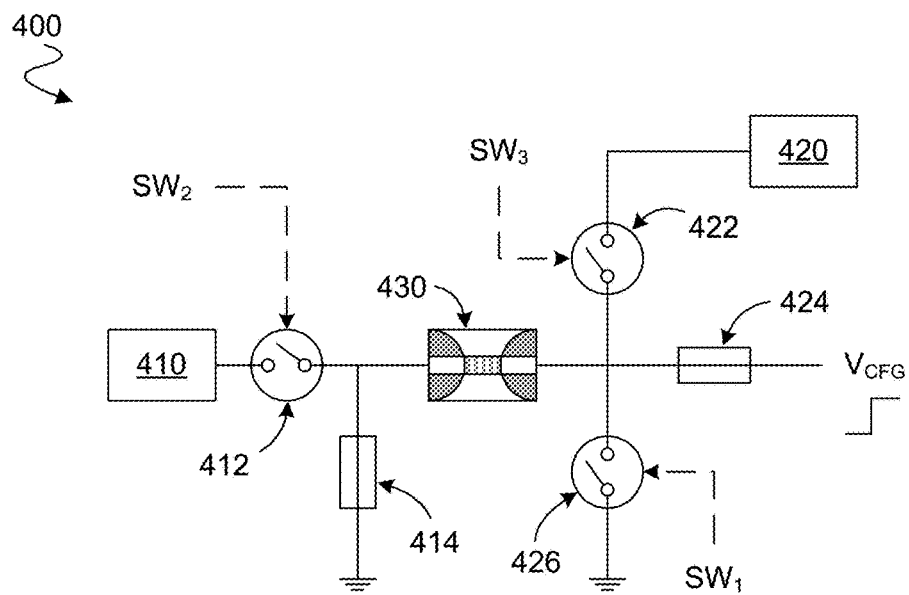
FIGS. 4A through 4C show circuit diagrams illustrating operation of a device to interconnect circuit components according to an embodiment.
Figure 4A:
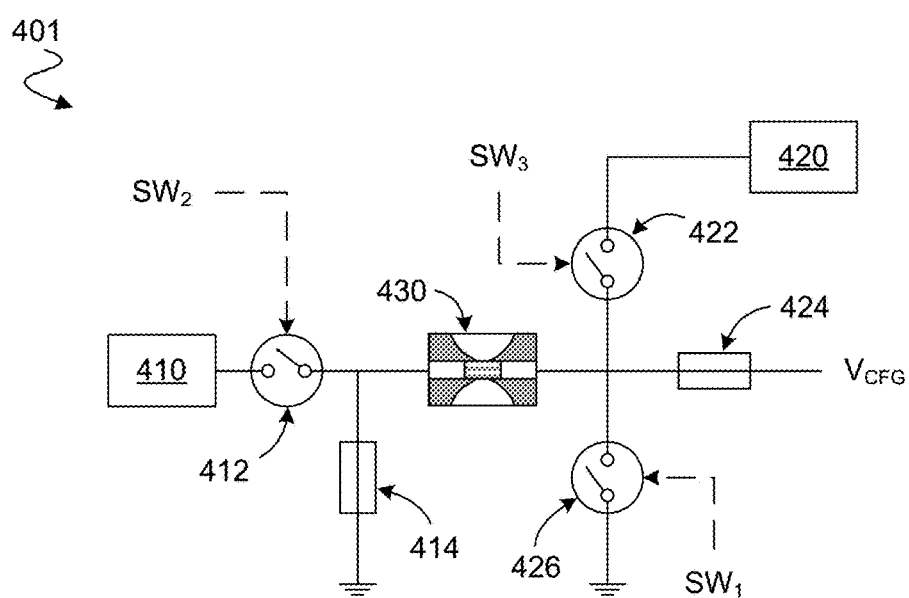
Figure 4B:
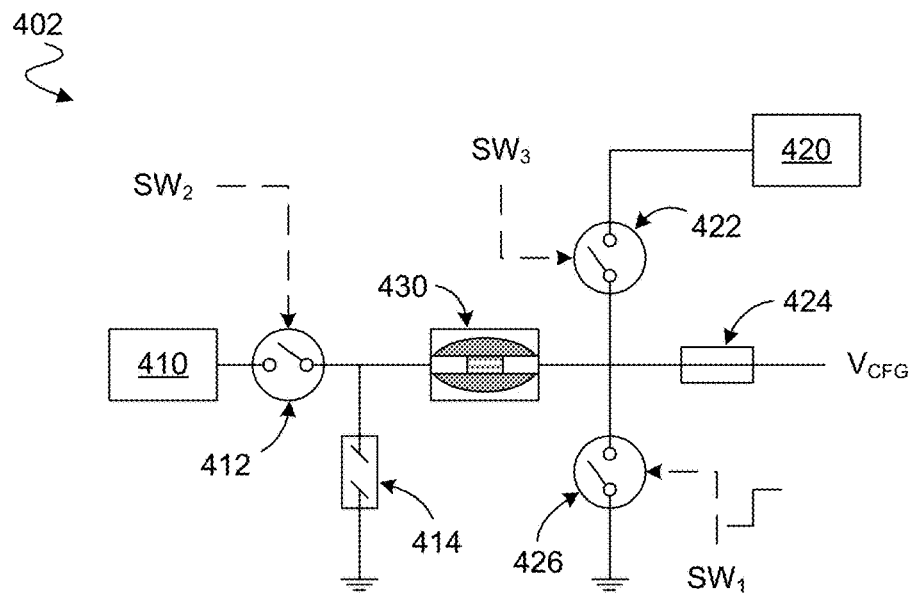
Figure 4B:
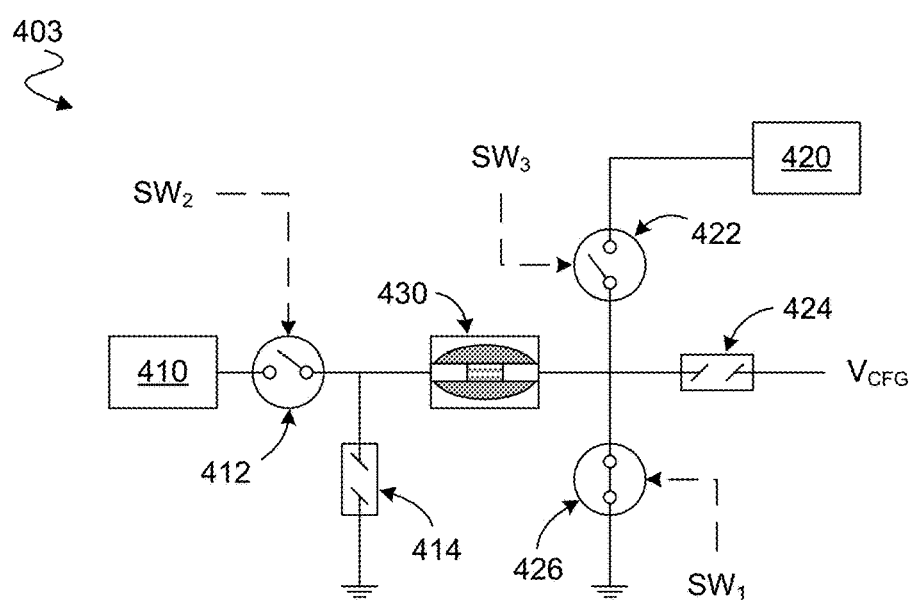
Figure 4C:
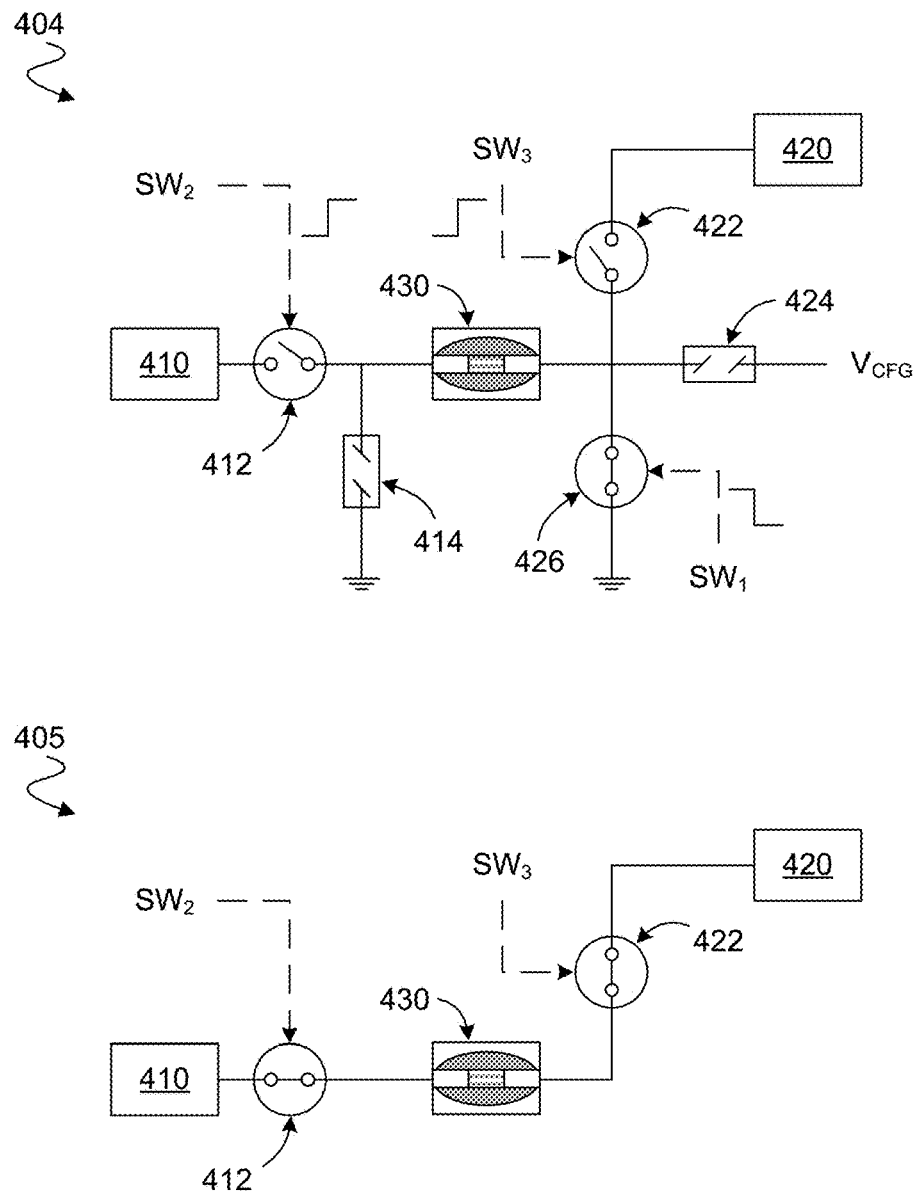

FIGS. 4A through 4C show stages 400 through stage 405 of operations to activate an antifuse functionality of a circuit, according to an embodiment. Stages 400 through 405 may include some or all operations of method 300, for example. In an embodiment, stages 400 through 405 provide for activation of antifuse device 130—e.g., to form a solder joint between circuit components. At stage 400, a first terminal of configurable interconnect 430 is coupled to first circuitry including circuit component 410, switch 412 and fuse 414. A second terminal of configurable interconnect 430 may be coupled to second circuitry comprising circuit component 420, switch 422, fuse 424 and switch 426. At stage 400, switches 412, 422 and 426 are in respective open states when a voltage $V_{CFG}$ is transitioned to a voltage level that results in a potential difference across configurable interconnect 430. The potential difference may result in heating and flow of a solder compound of configurable interconnect 430. As shown at stage 401, such solder may close a circuit path across two terminals of configurable interconnect 430.

The voltage difference may result in heating and flow of a solder compound at configurable interconnect 430. As shown at stage 401, such solder flow may close a circuit path across the terminals, resulting in an increased voltage difference across fuse 414. The voltage drop across fuse 414 may result in fuse 414 being activated (blown)—as shown at stage 402—to from an open circuit between the first terminal of configurable interconnect 430 and a reference (ground) potential. After fuse 414 is blown (e.g., in response to an indication of a resulting change in current and/or voltage), a control signal $SW_1$ may be transitioned to set a closed state of switch 426, resulting in a voltage difference across fuse 424. As shown at stage 403, application of voltage $V_{CFG}$ across fuse 424 may result in fuse 424 being activated (blown) to electrically isolate an input for $V_{CFG}$ from configurable interconnect 430. After fuse 424 is blown (e.g., in response to an indication of a resulting change in current and/or voltage), control signals $SW_2$, $SW_3$ may be variously transitioned (at stage 404) to set respective closed states of switches 412, 422. Moreover, $SW_1$ may be transitioned to reset an open state of switch 426. As shown at stage 405, the selective setting of switches 412, 422, 426 may result in coupling of circuit components 410 and 420 to each other via a solder joint of configurable interconnect 430, and switched decoupling of various paths to a ground or other such reference potential.

Figure 5:
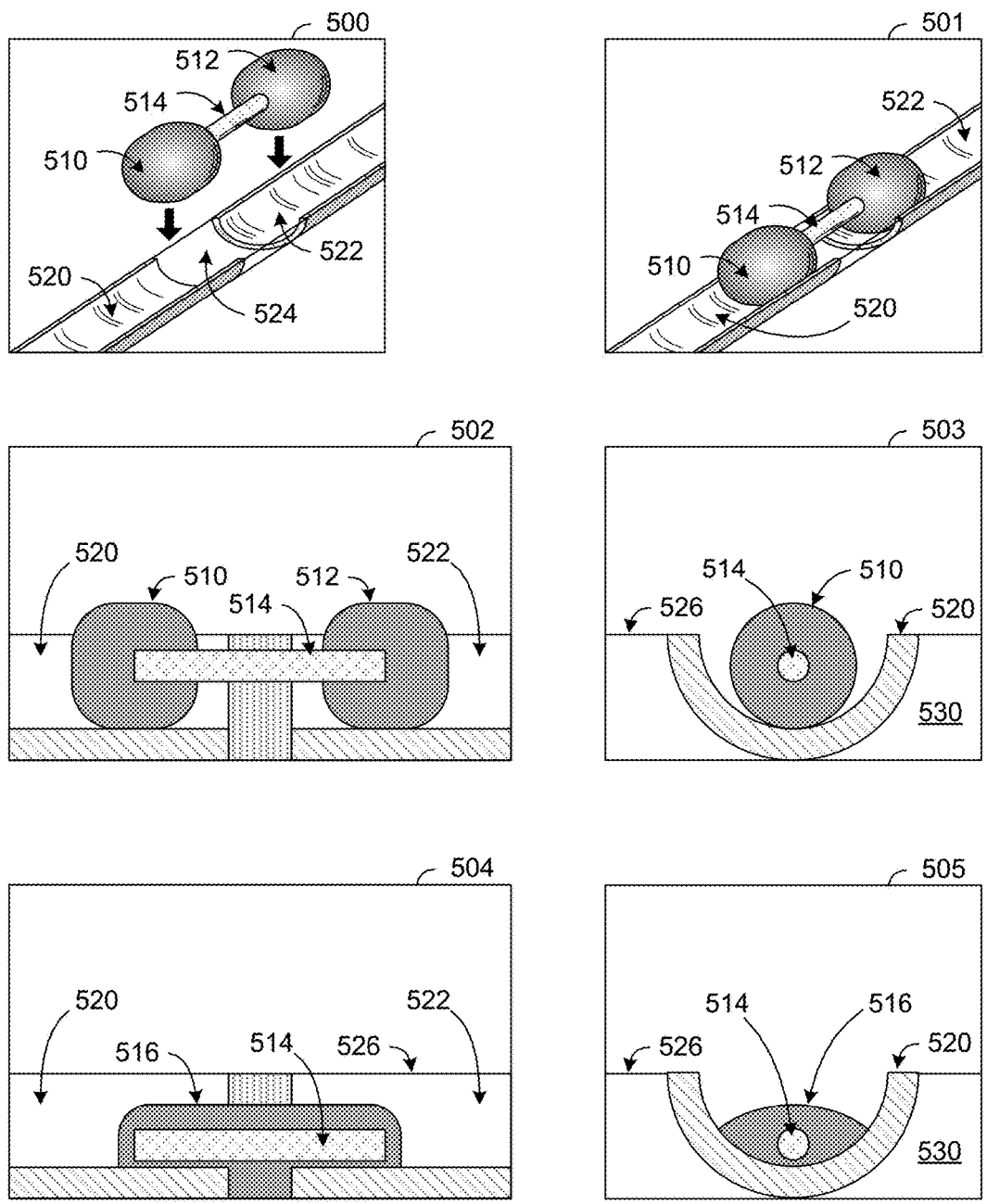
FIG. 5 shows perspective views and cross-sectional views of a device that is operable, according to an embodiment, to interconnect circuit components.

FIG. 5 shows perspective views of structures during stages 500, 501 of processing to provide an antifuse device according to an embodiment. Processing such as that shown at stages 500, 501 may include some or all of method 300—e.g., wherein the processing is to provide antifuse device 130 or configurable interconnect 430. In the illustrative embodiment shown, a side 526 of substrate 530 has formed therein conductors 520, 522, wherein a region 524 is disposed there between. Conductors 520, 522 and region 524 may be formed by any of the variety of additive and/or subtractive processes—including some or all of masking, lithography, etching, electroplating and/or the like—adapted, for example, from conventional fabrication techniques. As shown at stage 500, solder balls 510, 512 may be variously pick-placed, plated or otherwise deposited each in a respective recess of conductors 520, 522. At stage 501, span structure 514 may extend across region 524 to couple solder balls 510, 512 to one another via a high impedance path. By way of illustration and not limitation, a preformed assembly including solder balls 510, 512 and span structure 514 may be adhered in place.

FIG. 5 also shows cross-sectional side view 502 and cross-sectional end view 503 to illustrate structure at stage 501. As variously shown in views 502, 503, one or both of conductors 520, 522 may have a concave cross-sectional profile to accommodate span structure 514 and/or an alloy of solder balls 510, 512. Conductors 520, 522 are just two examples of an interconnect that forms, or is otherwise disposed in, a trench or other recessed structure which is in or on a substrate. Such an interconnect may alternatively form an angled (V-shape), rectilinear (e.g., square) or other cross-sectional recess in substrate 530. The particular configuration of span structure 514 and solder balls 510, 512 relative to such recessed conductor structures is merely illustrative, and may vary in different embodiments.

At some point after stage 501, the antifuse device may be activated to form a solder joint between conductors 520, 522. For example, application of a voltage difference across span structure 514 may result in heating of solder ball 510 and/or solder ball 512. In response to such heating, a solder joint 516 may be formed by a metal alloy of solder balls 510, 512 flowing into region 524 (as variously shown in cross-sectional side view 504 and cross-sectional end view 505).

Figure 6A:
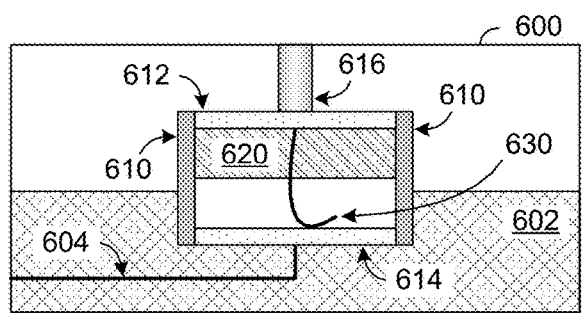
FIGS. 6A, 6B show cross-sectional views of respective devices that are operable, each according to a corresponding embodiment, to interconnect circuit components.
Figure 6A:
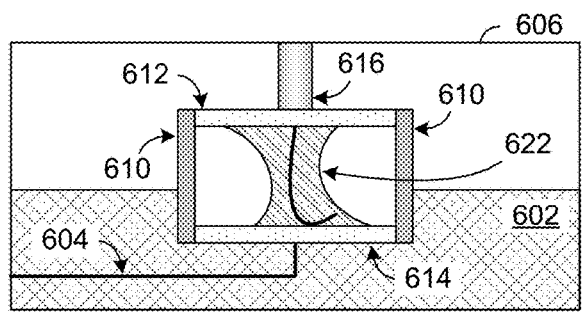

FIG. 6A shows cross sectional views 600, 606 illustrating respective configurations of a device to provide antifuse functionality according to an embodiment. The device may include some or all features of antifuse device 130 or configurable interconnect 430, for example. In an embodiment, functionality of the device may be provided according to one or more operations of method 300.

In the configuration shown by view 600, the device includes structures variously disposed in or on a substrate 602—e.g., wherein such structures are to facilitate formation of a solder joint between signal line 616 and trace 604. By way of illustration and not limitation, the device may include a conductor 612 and a conductor 614 disposed at opposite ends of a wall structure 610. Wall structure 610, conductor 612 and conductor 614 may form at least in part a chamber in which is disposed solder 620. In some embodiments, an antifuse device further comprises a filament 630, which extends through the chamber and which is coupled to one or both of conductors 612, 614. Filament 630 may extend through or approximate to solder 620. As shown in view 606, activation of the antifuse device may include inducing flow of solder 620—e.g., by application of a potential difference across conductors 612, 614. For example, the application of such a potential difference my result in heating of solder 620—e.g., by heating of a high impedance material of filament 630. A resulting flow of solder 620 may be directed, at least in part, by filament 630 to facilitate formation of a solder joint 622, which extends to both of conductors 612, 614.

Figure 6B:
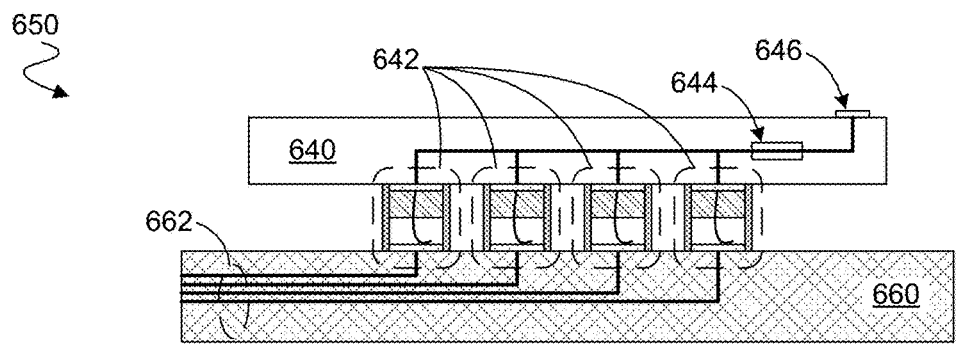
Figure 6B:
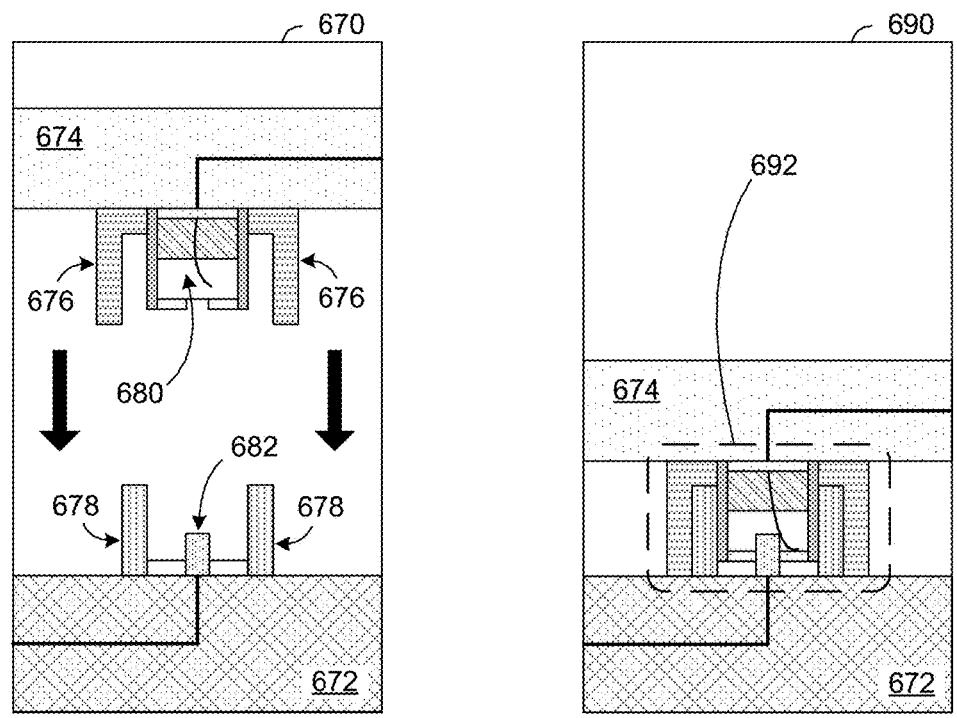

FIG. 6B shows a cross sectional side view of a system 650 to provide antifuse functionality according to an embodiment. System 650 may include some or all of the features of system 100. For example, of system 650 may be provided according to operations of method 300. In the illustrative embodiment shown, system 650 includes substrate 660 having disposed therein or thereon traces 662 each to be coupled to another substrate 640 via a respective one of configurable interconnects 642. Some or all of configurable interconnects 642 may each comprise respective structures such as those shown in view 600 and/or view 606. One or more of configurable interconnects 642 may be selectively activated each to form a respective solder joint to couple to a corresponding one of traces 662. In an embodiment, the selective activation of configurable interconnects 642 may be implemented using a common conductor 646—e.g., where conductor 646 is to provide $V_{CFG}$ or another such voltage. Alternatively or in addition selective activation of configurable interconnects 642 may be implemented using a common one or more fuses (such as the illustrative fuse 644 shown). In one example embodiment, fuse 644 corresponds functionally to fuse 124, for example. System 650 may further comprise additional fuses and/or switches (not shown) to facilitate the formation of respective solder joints each at a corresponding one of configurable interconnects 642.

FIG. 6B further shows cross-sectional views 670, 690 of respective stages of assembly for devices to be interconnected using antifuse functionality according to an embodiment. The stages of assembly variously shown in views 670, 690 may provide or otherwise be performed with circuitry of system 100 or system 650, for example. Such assembly may be performed according to operations of method 300.

As shown in view 670, a first device may include a substrate 672 (e.g., substrate 660) having disposed therein or thereon one or more traces each to be coupled to a corresponding trace in another substrate 674 (e.g., substrate 640) of a second device. In the illustrative embodiment, an antifuse device 680 disposed in or on substrate 674, and is configured to connect to, and form a solder joint with, an electrode portion 682 that is formed in or on a side of substrate 672. For example, a conductor of antifuse device 680 (corresponding functionally to one of conductors 612, 614, for example) may have formed therein a hole to receive electrode portion 682. Coupling of electrode portion 682 into antifuse device 680 may enable or otherwise facilitate the formation of a solder joint with antifuse device 680—e.g., wherein such coupling results in contact between electrode portion 682 and a high-impedance filament of antifuse device 680.

Views 670, 690 illustrate one example embodiment wherein an antifuse device includes, is integrated with, disposed in, adjoins, or is otherwise configured to operate with connector hardware to facilitate mechanical coupling of the antifuse device with other interconnect structures. In such embodiments, reciprocal mechanical connector structures (such as the illustrative female connector 676 and male connector 678 shown) may be variously formed on respective devices to facilitate alignment and/or securing of antifuse device 680 and electrode portion 682 with one another. Any of a variety of additional or alternative connector structures—e.g., adapted from conventional male-female or other connector mechanisms—may facilitate such connection. In other embodiments, connectors 676, 678 may be omitted.

As shown in view 690, mechanical connection with antifuse device 680, electrode portion 682 and connectors 676, 678 may provide an assembly 692 operable to automatically form a solder joint connection between respective traces of substrates 672, 674. A subsequent formation of such a solder joint may be performed automatically using state machine circuitry (not shown), as variously described herein.

As variously illustrated by views 600, 606, system 650 and views 670, 690, an antifuse device may be disposed in or on a substrate, where a surface of that substrate extends in a given plane. The antifuse device may be configured to facilitate an automatic formation of a solder joint, according to some embodiments, that provides a conductive path in a direction that is orthogonal to the given plane. For example, an antifuse device may be activated to form a solder joint between a stacked configuration of two or more substrates. An antifuse device may be operated, in some embodiments, to couple a substrate of a first device to a second device. The first device may function as a "mother" device at least with respect to operations that determine activation of the antifuse device. For example, the second device may be a corresponding "daughter" device, wherein detection of a presence of the daughter device by the mother device results in an application of a voltage by the mother device to initiate an activation of the antifuse device. In one such embodiment, a solder joint may be formed between a host system and a plug-and-play device that is to be added to the host system.

Alternatively or in addition, an antifuse device may be activated to form a solder joint between different metallization layers of the same substrate. For example, a substrate may have multiple antifuse devices, some or all of which may be variously located at different respective levels in the substrate. In some embodiments, multiple antifuses are variously disposed in or on a substrate, wherein such multiple antifuse devices are arranged in a hierarchical configuration. For example, respective activations of such antifuses may be performed sequentially and automatically, based on the hierarchical arrangement thereof. In such an embodiment, a change to a state of activation of one antifuse of the hierarchy may automatically determine a subsequent change to a state of activation of another antifuse at a relatively lower level in that hierarchy. In some embodiments, one or more common fuses and/or one or more common switches are operated to control the establishing of interconnections via multiple respective antifuse devices.

Figure 7:
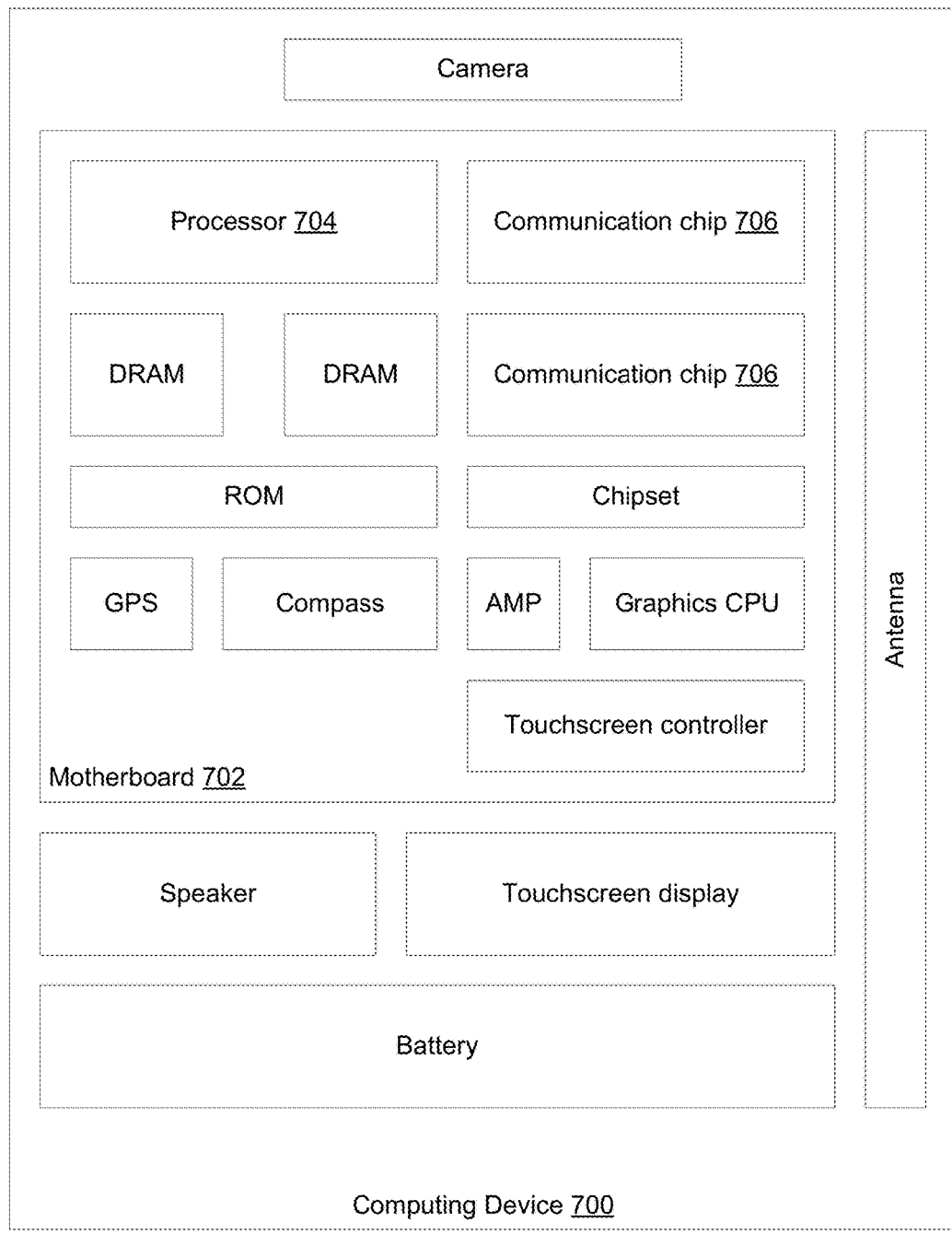
FIG. 7 is a functional block diagram illustrating elements of a computing device in accordance with one embodiment.

FIG. 7 illustrates a computing device 700 in accordance with one embodiment. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The term "processor" may refer to any device or portion of a device that processes electronic data from registers and/or memory to transform that electronic data into other electronic data that may be stored in registers and/or memory. The communication chip 706 also includes an integrated circuit die packaged within the communication chip 706.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
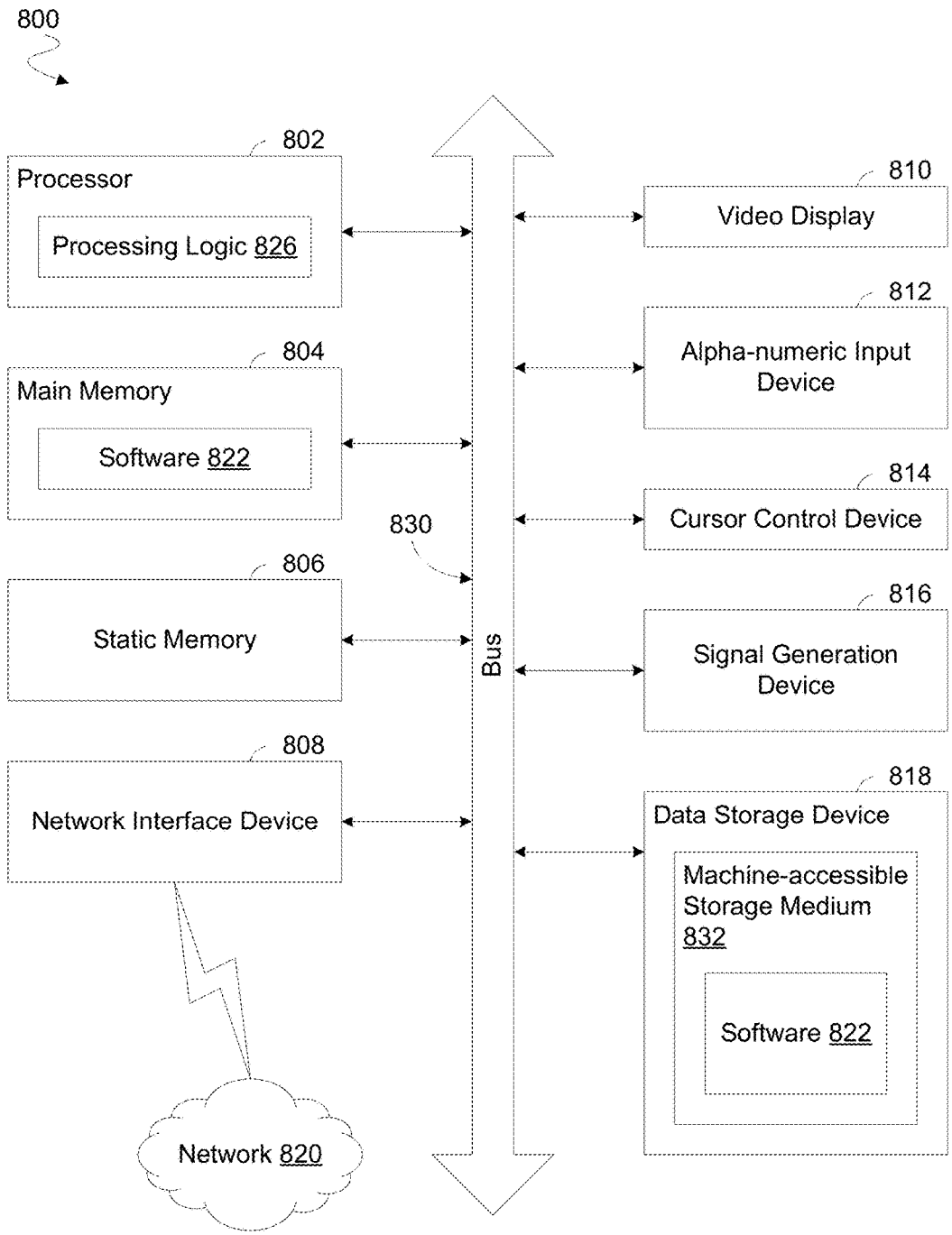
FIG. 8 is a functional block diagram illustrating elements of an exemplary computer system, in accordance with an embodiment.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, an apparatus comprises an antifuse device disposed in or on a substrate, the antifuse device configured to form a solder joint in response to a voltage at an input node, a first fuse disposed coupled between the input node and a first terminal of the antifuse device, and a first switch, wherein the first fuse and the first terminal are each coupled to a reference node via the first switch. The apparatus further comprises a second switch disposed in or on the substrate, the second switch configured to switchedly couple a first circuit component to the first terminal, and a state machine disposed in or at a side of the substrate, the state machine comprising circuitry configured to automatically transition, based on the voltage at the input node, through a plurality of states according to a pre-defined sequence to operate the first switch and the second switch, wherein the state machine to control a coupling of the first circuit component to a second component via the solder joint.

In one embodiment, one or more of the first fuse, the first switch and the second switch are disposed in or at a side of the substrate. In another embodiment, the apparatus further comprises a third switch configured to switchedly couple a second circuit component to a second terminal of the antifuse device, and a second fuse coupled to the second terminal, wherein the third switch the second terminal are each coupled to the reference potential node via the second fuse. In another embodiment, the apparatus further comprises the first circuit component. In another embodiment, the antifuse device includes an interconnect forming a trench structure. In another embodiment, the antifuse device includes a filament structure extending between the first terminal and the second terminal. In another embodiment, the antifuse device includes an air gap or a tungsten span structure disposed between the first terminal and the second terminal. In another embodiment, the apparatus further comprises one or more other antifuse devices each disposed in or on the substrate, the one or more other antifuse devices configured to be activated in response to the voltage at the input node. In another embodiment, a printed circuit board includes the substrate. In another embodiment, an interposer includes the substrate. In another embodiment, an integrated circuit die includes the substrate.

In another implementation, a method comprises, with a voltage at an input node, applying a voltage difference across a first terminal of an antifuse device and a second terminal of the antifuse device, the antifuse device disposed in or on a substrate, and forming a solder joint between the first terminal and the second terminal in response to the voltage difference. The method further comprises, based on the forming the solder joint, automatically transitioning a state machine through a plurality of states according to a pre-defined sequence, the state machine including circuitry in or at a side of the substrate, wherein the transitioning results in operation of a first switch and a second switch each disposed in or on the substrate, wherein a first fuse is coupled between the input node and the first terminal, wherein the first fuse and the first terminal are each coupled to a reference potential via the first switch, wherein the second switch switchedly couples the first terminal to a first circuit component disposed in or on the substrate, and wherein the transitioning controls a coupling of the first circuit component to a second component via the solder joint.

In one embodiment, one or more of the first fuse, the first switch and the second switch are disposed in or at a side of the substrate. In another embodiment, the transitioning further results in operation of a third switch to couple a second circuit component to a second terminal of the antifuse device, wherein the third switch the second terminal are each coupled to a reference potential node via a second fuse. In another embodiment, the antifuse device includes an interconnect forming a trench structure. In another embodiment, the antifuse device includes a filament structure extending between the first terminal and the second terminal. In another embodiment, the antifuse device includes an air gap or a tungsten span structure disposed between the first terminal and the second terminal. In another embodiment, a printed circuit board includes the substrate. In another embodiment, an interposer includes the substrate. In another embodiment, an integrated circuit die includes the substrate.

In another implementation, a system comprises an antifuse device disposed in or on a substrate, the antifuse device configured to form a solder joint in response to a voltage at an input node, a first fuse disposed coupled between the input node and a first terminal of the antifuse device, a first switch, wherein the first fuse and the first terminal are each coupled to a reference node via the first switch, and a second switch disposed in or on the substrate, the second switch configured to switchedly couple a first circuit component to the first terminal. The system further comprises a state machine disposed in or at a side of the substrate, the state machine comprising circuitry configured to automatically transition, based on the voltage at the input node, through a plurality of states according to a pre-defined sequence to operate the first switch and the second switch, wherein the state machine to control a coupling of the first circuit component to a second component via the solder joint, and a display coupled to the substrate, the display to generate an image based on a communication between the first circuit component and the second circuit component.

In one embodiment, one or more of the first fuse, the first switch and the second switch are disposed in or at a side of the substrate. In another embodiment, the system further comprises a third switch configured to switchedly couple a second circuit component to a second terminal of the antifuse device, and a second fuse coupled to the second terminal, wherein the third switch the second terminal are each coupled to the reference potential node via the second fuse. In another embodiment, the antifuse device includes an interconnect forming a trench structure. In another embodiment, the antifuse device includes a filament structure extending between the first terminal and the second terminal. In another embodiment, the antifuse device includes an air gap or a tungsten span structure disposed between the first terminal and the second terminal. In another embodiment, the system further comprises one or more other antifuse devices each disposed in or on the substrate, the one or more other antifuse devices configured to be activated in response to the voltage at the input node. In another embodiment, a printed circuit board includes the substrate. In another embodiment, an interposer includes the substrate. In another embodiment, an integrated circuit die includes the substrate.

Techniques and architectures for forming a soldered electrical connection are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An apparatus for interconnecting circuitry, the apparatus comprising:
   an antifuse device disposed in or on a substrate, the antifuse device configured to form a solder joint in response to a voltage at an input node;
   a first fuse disposed coupled between the input node and a first terminal of the antifuse device;
   a first switch, wherein the first fuse and the first terminal are each coupled to a reference node via the first switch;
   a second switch disposed in or on the substrate, the second switch configured to switchedly couple a first circuit component to the first terminal; and
   a state machine disposed in or at a side of the substrate, the state machine comprising circuitry configured to automatically transition, based on the voltage at the input node, through a plurality of states according to a pre-defined sequence to operate the first switch and the second switch, wherein the state machine to control a coupling of the first circuit component to a second component via the solder joint.

2. The apparatus of claim 1, wherein one or more of the first fuse, the first switch and the second switch are disposed in or at a side of the substrate.

3. The apparatus of claim 1, further comprising:
   a third switch configured to switchedly couple a second circuit component to a second terminal of the antifuse device; and
   a second fuse coupled to the second terminal, wherein the third switch the second terminal are each coupled to the reference potential node via the second fuse.

4. The apparatus of claim 1, wherein the antifuse device includes an interconnect forming a trench structure.

5. The apparatus of claim 1, wherein the antifuse device includes a filament structure extending between the first terminal and a second terminal.

6. The apparatus of claim 1, wherein the antifuse device includes an air gap or a tungsten span structure disposed between the first terminal and a second terminal.

7. The apparatus of claim 1, further comprising one or more other antifuse devices each disposed in or on the substrate, the one or more other antifuse devices configured to be activated in response to the voltage at the input node.

8. The apparatus of claim 1, wherein the substrate includes a printed circuit board.

9. The apparatus of claim 1, wherein the substrate includes an interposer.

10. The apparatus of claim 1, wherein the substrate includes an integrated circuit die.

11. A system for interconnecting circuitry, the system comprising:
    an antifuse device disposed in or on a substrate, the antifuse device configured to form a solder joint in response to a voltage at an input node;
    a first fuse disposed coupled between the input node and a first terminal of the antifuse device; a first switch, wherein the first fuse and the first terminal are each coupled to a reference node via the first switch;
    a second switch disposed in or on the substrate, the second switch configured to switchedly couple a first circuit component to the first terminal;
    a state machine disposed in or at a side of the substrate, the state machine comprising circuitry configured to automatically transition, based on the voltage at the input node, through a plurality of states according to a pre-defined sequence to operate the first switch and the second switch, wherein the state machine to control a coupling of the first circuit component to a second circuit component via the solder joint; and a display coupled to the substrate, the display to generate an image based on a communication between the first circuit component and the second circuit component.

12. The system of claim 11, wherein one or more of the first fuse, the first switch and the second switch are disposed in or at a side of the substrate.

13. The system of claim 11, further comprising:
a third switch configured to switchedly couple the second circuit component to a second terminal of the antifuse device; and
a second fuse coupled to the second terminal, wherein the third switch and the second terminal are each coupled to the reference potential node via the second fuse.

14. The system of claim 11, wherein the antifuse device includes an interconnect forming a trench structure.

15. The system of claim 11, wherein the antifuse device includes a filament structure extending between the first terminal and a second terminal.

\* \* \* \* \*